(12) United States Patent
Ugaji et al.

(10) Patent No.: US 8,373,419 B2
(45) Date of Patent: Feb. 12, 2013

(54) LIFETIME ESTIMATING METHOD AND DETERIORATION SUPPRESSING METHOD FOR RECHARGEABLE LITHIUM BATTERY, LIFETIME ESTIMATING APPARATUS, DETERIORATION SUPPRESSOR, AND BATTERY PACK AND CHARGER USING THE SAME

(75) Inventors: Masaya Ugaji, Osaka (JP); Taisuke Yamamoto, Nara (JP)

(73) Assignee: Panasonic Corporation, Osaka (JP)

( * ) Notice: Subject to any disclaimer, the term of this patent is extended or adjusted under 35 U.S.C. 154(b) by 326 days.

(21) Appl. No.: 12/741,171

(22) PCT Filed: Dec. 11, 2008

(86) PCT No.: PCT/JP2008/003709
§ 371 (c)(1),
(2), (4) Date: May 3, 2010

(87) PCT Pub. No.: WO2009/075109
PCT Pub. Date: Jun. 18, 2009

(65) Prior Publication Data
US 2010/0264929 A1    Oct. 21, 2010

(30) Foreign Application Priority Data
Dec. 13, 2007   (JP) ................................. 2007-321840

(51) Int. Cl.
*H02J 7/00*       (2006.01)
*G01N 27/416*    (2006.01)
*G01R 31/36*     (2006.01)

(52) U.S. Cl. ........ 324/426; 320/107; 320/116; 320/130; 320/131; 320/132; 702/63

(58) Field of Classification Search .................. 324/426; 320/107, 130
See application file for complete search history.

(56) References Cited

U.S. PATENT DOCUMENTS 6,081,097 A  *  6/2000  Seri et al. ...................... 320/128
6,472,847 B2 * 10/2002  Lundberg ...................... 320/132
(Continued)

FOREIGN PATENT DOCUMENTS

JP   06-089745 A    3/1994
JP   06-331714 A   12/1994
(Continued)

OTHER PUBLICATIONS

International Search Report for International Application No. PCT/JP2008/003709, dated Mar. 17, 2009, 1 page.

*Primary Examiner* — Drew A Dunn
*Assistant Examiner* — Nathaniel Pelton
(74) *Attorney, Agent, or Firm* — Brinks Hofer Gilson & Lione

(57) ABSTRACT

In a lifetime estimating method for a rechargeable lithium battery, the open circuit voltages of the rechargeable lithium battery after discharging for at least two different charge/discharge cycle numbers are detected while charge/discharge cycles go on. Next, at least the two of the voltage values are plotted for respective cycle numbers, and a circular arc passing the plotted points is drawn. Furthermore, the lifetime of the rechargeable lithium battery is estimated based on a size of the circular arc. The progression of deterioration can be suppressed by controlling the charge and discharge of the rechargeable lithium battery based on the lifetime estimation.

28 Claims, 7 Drawing Sheets

U.S. PATENT DOCUMENTS

| | | | |
|---|---|---|---|
| 6,480,003 B1 * | 11/2002 | Ugaji et al. | 324/430 |
| 6,892,148 B2 * | 5/2005 | Barsoukov et al. | 702/63 |
| 7,109,729 B2 * | 9/2006 | Schilowitz et al. | 324/698 |
| 7,235,326 B2 * | 6/2007 | Nakamura et al. | 429/49 |
| 8,125,185 B2 * | 2/2012 | Takeno | 320/130 |
| 8,129,998 B2 * | 3/2012 | Watanabe et al. | 324/430 |
| 8,129,999 B2 * | 3/2012 | Szuba et al. | 324/430 |
| 2003/0062875 A1 * | 4/2003 | Nakamura et al. | 320/132 |
| 2005/0208368 A1 * | 9/2005 | Nakamura et al. | 429/49 |

FOREIGN PATENT DOCUMENTS

| | | |
|---|---|---|
| JP | 11-233155 A | 8/1999 |

\* cited by examiner

LIFETIME ESTIMATING METHOD AND DETERIORATION SUPPRESSING METHOD FOR RECHARGEABLE LITHIUM BATTERY, LIFETIME ESTIMATING APPARATUS, DETERIORATION SUPPRESSOR, AND BATTERY PACK AND CHARGER USING THE SAME

This application is a U.S. national phase application of PCT/JP2008/003709 having an international filing date of Dec. 11, 2008, which claims priority to JP 2007-321840 filed on Dec. 13, 2007, the entire content of which is incorporated herein by reference.

TECHNICAL FIELD

The present invention relates to methods of estimating the lifetime of a rechargeable lithium battery, and charge/discharge control for suppressing deterioration of the battery.

BACKGROUND ART

Recently, a demand for batteries as a power source has increased in response to development of portable devices such as personal computers and mobile phones. Batteries for these applications are expected to be used at normal temperatures, and to have a large energy density and good cycle characteristics.

In order to satisfy this demand, new active materials with large capacity density have been developed for a positive electrode and negative electrode, respectively. In particular, there is a great interest especially in using elemental silicon (Si) or tin (Sn), or oxides thereof providing extremely large capacity density as a negative active material.

However, rechargeable lithium batteries where these materials are used as the negative active materials do not exhibit sufficient charge/discharge cycle characteristics. Specifically, silicon oxide ($SiO_{0.3}$) is used as a negative active material. A positive electrode of lithium cobalt oxide ($LiCoO_2$), which is generally used for rechargeable lithium batteries, is used as a positive active material. As electrolyte, a mixed solution of ethylene carbonate (EC) and ethylmethylcarbonate (EMC) containing lithium hexafluorophosphate ($LiPF_6$) is used. These materials are used for manufacturing a winding type rechargeable lithium battery. When this battery is repeatedly charged and discharged under the condition: charge/discharge current of 1.0 C; charge cutoff voltage of 4.2 V; and discharge cutoff voltage of 2.5 V, its capacity significantly reduces at about 100-th cycle.

In order to suppress this capacity reduction, it is preferable to minimize the discharge potential of the negative electrode. For example, Patent Document 1 discloses that the discharge cutoff potential of the negative electrode is controlled to 0.6 V or lower with respect to a lithium reference electrode in a rechargeable lithium battery using silicon oxide (SiO) as the negative active material. Such control suppresses the capacity reduction in the charge/discharge cycles.

When the lithium reference electrode is provided in the battery in order to control the discharge potential of the negative electrode made of SiO with respect to the lithium reference electrode as in Patent Document 1, however, a battery structure becomes complicated. Therefore, practical use of the rechargeable lithium battery of Patent Document 1 is difficult. In other words, the battery requires a third electrode terminal, in addition to positive and negative electrode terminals.

In the initial period of the charge/discharge cycles, deterioration in positive and negative active materials is small. When the charge/discharge cycle is repeated from this state, the respective potential ranges in which positive and negative electrodes are used vary with deterioration of positive and negative active materials. Therefore, even when the discharge cutoff voltage is set so that the discharge cutoff potential of the negative electrode is 0.6 V or lower with respect to the positive electrode, it is difficult to determine whether the discharge cutoff potential of the negative electrode is actually maintained at 0.6 V or lower. Accordingly, it is difficult to detect the charge/discharge state of the negative electrode by measurement of the battery voltage and suppress the capacity reduction in the charge/discharge cycles.

Patent Document 1: Japanese Patent Unexamined Publication No. H11-233155

SUMMARY OF THE INVENTION

The present invention provides a method of estimating the lifetime of a rechargeable lithium battery in the charge/discharge cycles, and a method of suppressing the deterioration based on the estimation result. The present invention also provides a lifetime estimating apparatus, a deterioration suppressor, a charger, and a battery pack to which these methods are applied. The lifetime estimating method of the present invention is applicable to a rechargeable lithium battery including a positive electrode, a negative electrode, and an electrolyte. The positive electrode has a positive active material that absorbs and releases lithium ions, and the negative electrode has a negative active material that contains at least one of elements, silicon and tin. The electrolyte has lithium-ion conductivity and is disposed between the positive electrode and the negative electrode. The lifetime estimating method of the present invention includes the following four steps:

A) detecting open circuit voltages of the rechargeable lithium battery after discharging for at least two different charge/discharge cycle numbers while charge/discharge cycles go on;

B) plotting at least two of voltage values detected in step A for respective cycle numbers;

C) drawing a circular arc passing the plotted points of step B; and

D) estimating a deterioration level of the rechargeable lithium battery based on the size of the circular arc drawn in step C.

The battery voltage after the discharge cutoff is measured for various charge/discharge cycle numbers, and the lifetime of the rechargeable lithium battery can be accurately estimated based on the voltage variation.

A deterioration suppressing method of the present invention controls the charge or discharge condition of the rechargeable lithium battery based on the lifetime estimated by the lifetime estimating method.

According to the present invention, the lifetime can be accurately estimated even when the capacity of the rechargeable lithium battery reduces with the progression of the charge/discharge cycles. In addition, capacity reduction can be suppressed by controlling the charge/discharge condition in response to the lifetime. Therefore, the rechargeable lithium battery can be used in a state of a large capacity while the charge and discharge are repeated for many times.

DETAILED DESCRIPTION OF THE PREFERRED EMBODIMENTS

An exemplary embodiment of the present invention is described hereinafter with reference to the accompanying drawings. However, the present invention is not limited to the following description.

Figure 1:
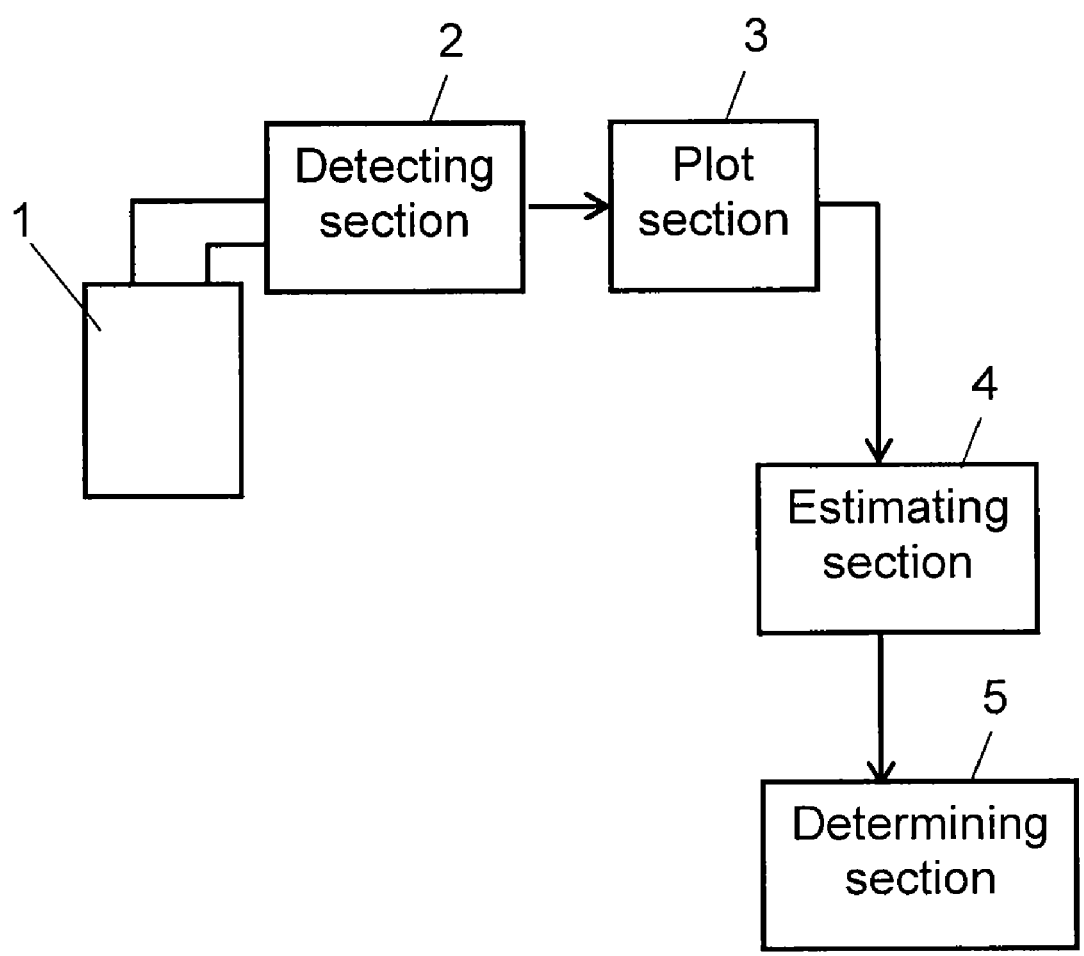
FIG. 1 is a block diagram showing a schematic configuration of a lifetime estimating apparatus for a rechargeable lithium battery in accordance with an exemplary embodiment of the present invention.

FIG. 1 is a block diagram showing a schematic configuration of a lifetime estimating apparatus for a rechargeable lithium battery in accordance with an exemplary embodiment of the present invention. The lifetime estimating apparatus includes detecting section 2, plot section 3, estimating section 4, and determining section 5. Detecting section 2 detects battery voltage of rechargeable lithium battery 1. Plot section 3 plots the detected voltage value with respect to each cycle number. Estimating section 4 draws a circular arc passing the plot points plotted by plot section 3. Determining section 5 estimates a deterioration level of rechargeable lithium battery 1 based on the size of the drawn circular arc. Here, the number of rechargeable lithium batteries 1 may be one or more. When one battery pack is formed of a plurality of rechargeable lithium batteries, rechargeable lithium battery 1 may be the battery pack. When one battery pack is formed of a plurality of rechargeable lithium batteries and one battery unit is formed of a plurality of battery packs, rechargeable lithium battery 1 may be the battery unit.

Figure 2:
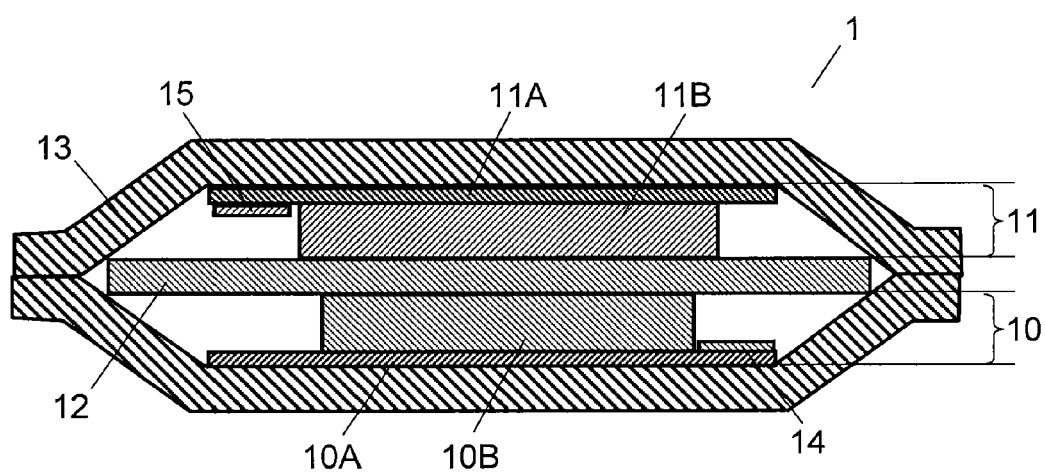
FIG. 2 is a sectional view showing a schematic structure of a laminated battery, which is an example of the rechargeable lithium battery whose lifetime is estimated by the lifetime estimating apparatus, in accordance with the exemplary embodiment of the present invention.

FIG. 2 is a sectional view showing a schematic structure of a laminated battery, which is an example of rechargeable lithium battery 1 whose lifetime is estimated by the lifetime estimating apparatus shown in FIG. 1. An electrode group is formed by stacking positive electrode 10, negative electrode 11, and separator 12 disposed between these electrodes. The electrode group and a nonaqueous electrolyte with lithium-ion conductivity are stored in outer casing 13. The nonaqueous electrolyte is impregnated into separator 12 and is disposed between positive electrode 10 and negative electrode 11.

Positive electrode 10 includes positive electrode collector 10A and positive active material layer 10B supported by positive electrode collector 10A. Negative electrode 11 includes negative electrode collector 11A and negative active material layer 11B supported by negative electrode collector 11A. Positive active material layer 10B generally includes a positive active material, conductivity aid, and binder, but it may include only the positive active material. Negative active material layer 11B also generally includes a negative active material, a conductivity aid, and a binder, but it may include only the negative active material.

Positive electrode collector 10A and negative electrode collector 11A are connected to one end of positive electrode lead 14 and one end of negative electrode lead 15, respectively. The other ends of positive electrode lead 14 and negative electrode lead 15 are led outside of outer casing 13, respectively.

Positive active material layer 10B includes the positive active material that can absorb and release lithium ions. This material is typically lithium cobalt oxide ($LiCoO_2$), lithium nickel oxide ($LiNiO_2$), or lithium manganese oxide ($LiMn_2O_4$), for example. However, the present invention is not limited to these materials. As positive electrode collector 10A, Al, Al alloy, Ni, Ti, and so on can be used.

As the nonaqueous electrolyte, various solid electrolytes with lithium-ion conductivity and nonaqueous electrolytic solutions can be used. As the nonaqueous electrolytic solution, it is preferable to use a solution including a nonaqueous solvent and a lithium salt dissolved therein. Publicly-known compositions are applicable to the nonaqueous electrolytic solution, and thus their compositions are not particularly limited.

As separator 12 and outer casing 13, materials generally used for rechargeable lithium batteries of various forms can be employed, without any limitation.

When silicon (Si) or tin (Sn) is used for negative active material layer 11B and when the battery is fully charged or fully discharged, the negative active material needs to be set to a state (non-fully charged state) that does not reach the fully charged state. Specifically, for example, the negative active material is set to a charged state of 90% or less when the battery is fully charged, and set to the charged state of 10% or more when the battery is fully discharged. In other words, negative electrode 11 is designed to have discharge reserve capacity.

When negative active material layer 11B comes into a charged state higher than 90% while the battery is fully charged, the layer is difficult to receive lithium ions and the reaction resistance increases. In other words, when negative active material layer 11B comes into a charged state higher than 90%, the lithium concentration in the negative active material increases and the interaction between lithium ions strengthen. This delays diffusion of lithium in the negative active material. In particular, a diffusion-limited state occurs on the surface of the negative active material. Accordingly, lithium ions that cannot be received from the nonaqueous electrolyte into the negative active material are deposited as metal lithium on the surface of negative active material layer 11B. Alternatively, even when lithium ions can be received, the lithium ions are received at only easy-to-receive portions. Therefore, portions having received lithium ions and portions that have not received lithium ions exist in a dotted manner, thereby making the composition of the negative active material nonuniform. When the charge/discharge cycles accompanied by production of such nonuniform composition is repeated, the charge/discharge capacity rapidly reduces.

When negative active material layer 11B comes into a charged state less than 10% while the battery is in the fully discharged state, it becomes difficult to extract lithium from negative active material layer 11B and the reaction resistance increases. This is because some lithium and Si or Sn alloyed with lithium form a skeleton structure in negative active material layer 11B. Therefore, when lithium forming the skeleton structure is also extracted during the discharge, the skeleton structure of negative active material layer 11B is destroyed and hence the negative active material deteriorates. As a result, when the discharge that leads to the destruction of the skeleton structure is repeated, the cycle life rapidly deteriorates.

As described above, when the battery is repeatedly charged and discharged while the charged state (charge depth) of negative active material layer 11B is out of the above-mentioned range, the reaction resistance increases.

In order to charge and discharge negative electrode 11 within the above-mentioned range, a charger is generally set so as to charge and discharge the battery within a predetermined voltage range. However, in response to respective cycle deteriorations of positive and negative active materials, the potential range varies in which both positive electrode 10 and negative electrode 11 are used. Therefore, it is difficult to suppress capacity reduction along with the charge/discharge cycles just by controlling the potential difference between positive electrode 10 and negative electrode 11, namely the battery voltage.

In the exemplary embodiment, the negative active material containing at least one of elements, Si and Sn is always kept in a charged state of 90% or lower while the battery is fully charged, and is always kept in a charged state of 10% or higher when the battery is fully discharged. In order to do that, detecting section 2 detects the open circuit voltages of rechargeable lithium battery 1 after discharging at least twice while the charge/discharge cycles go on. Plot section 3 plots the detected open circuit voltage value detected for each cycle number. Estimating section 4 draws a circular arc passing the plot points plotted by plot section 3. Determining section 5 estimates the lifetime of rechargeable lithium battery 1 based on the size of the circular arc.

Plot section 3 and estimating section 4 do not need to actually draw points or a circular arc on a page space or screen, namely they are simply required to calculate the size of the circular arc. Determining section 5 is simply required to estimate the intersection (cycle number) of the circular arc and the horizontal axis, for example. Therefore, plot section 3, estimating section 4, and determining section 5 can be formed of microcomputers and programs. Alternatively, a user may perform these operations without using plot section 3, estimating section 4, and determining section 5.

When the ambient temperature largely varies, more preferably, the detected battery voltage is corrected in consideration of the actual temperature of the rechargeable lithium battery. In addition, it is preferable to detect the battery voltage of the open circuit after a certain set time after discharging. The set time is not especially limited, but about one second to one hour is preferable. Especially, it is preferable to set a sufficient time from the cutoff of the discharge to measurement of the open circuit voltage.

Figure 3A:
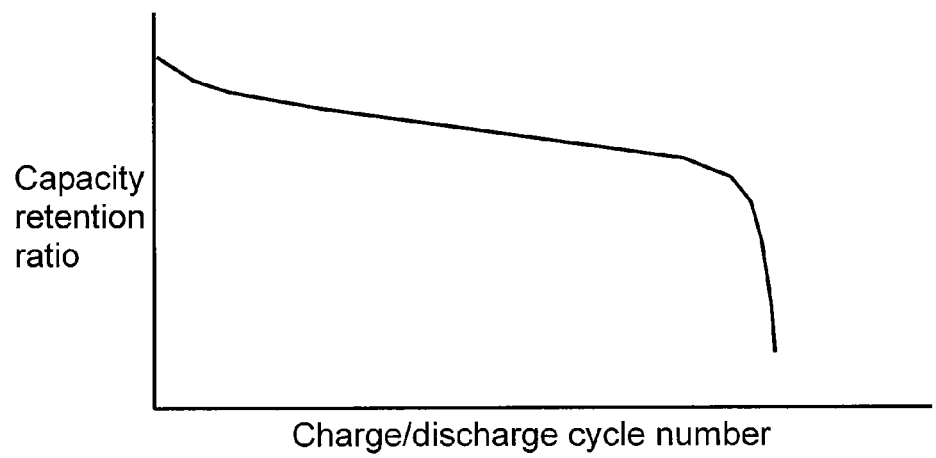
FIG. 3A is a diagram that illustrates the principle of the lifetime estimating method and shows the relation between the capacity retention ratio and charge/discharge cycles of the rechargeable lithium battery in accordance with the exemplary embodiment of the present invention.
Figure 3B:
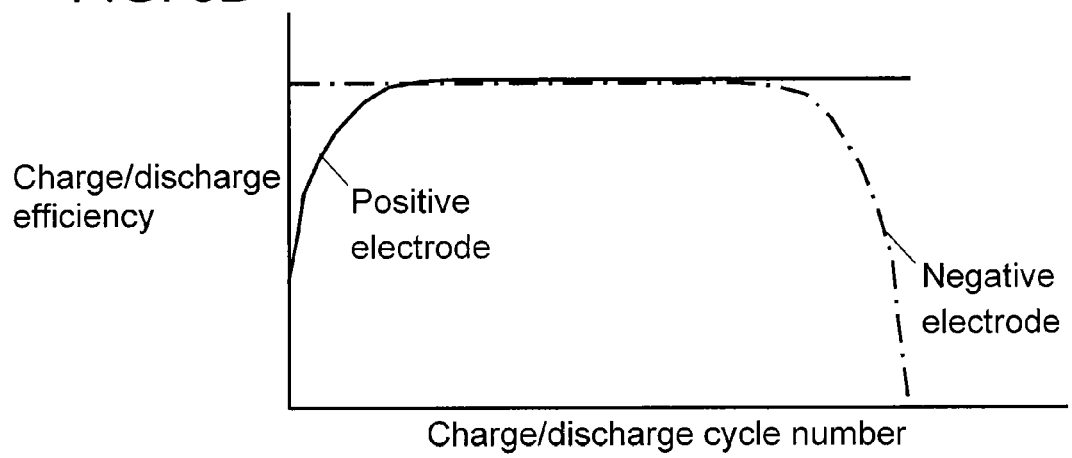
FIG. 3B is a diagram that illustrates the principle of the lifetime estimating method and shows the relation between the charge/discharge efficiency and charge/discharge cycles of a positive electrode and negative electrode of the rechargeable lithium battery in accordance with the exemplary embodiment of the present invention.
Figure 3C:
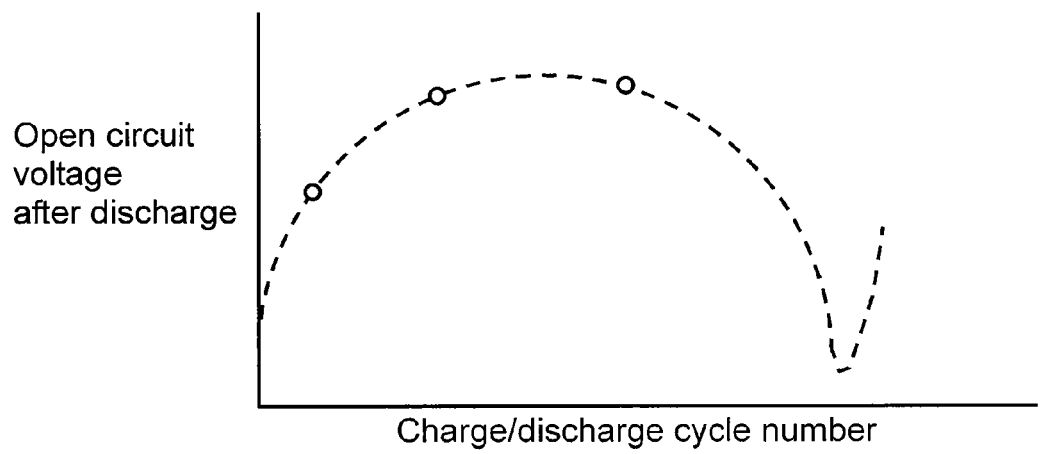
FIG. 3C is a diagram that illustrates the principle of the lifetime estimating method and shows the relation between the open circuit voltage after discharging of the rechargeable lithium battery and charge/discharge cycles in accordance with the exemplary embodiment of the present invention.

The reason why the lifetime of rechargeable lithium battery 1 can be estimated by such a method is described hereinafter. FIG. 3A through FIG. 3C are diagrams for illustrating the principle of the lifetime estimating method in accordance with the exemplary embodiment of the present invention. FIG. 3A shows the variation of the capacity retention ratio of rechargeable lithium battery 1 in response to the charge/discharge cycles. FIG. 3B shows the variations of the charge/discharge efficiency of positive electrode 10 and negative electrode 11. FIG. 3C shows the variation of the open circuit voltage after discharging.

As described above, the battery using a negative active material containing at least one of elements Si and Sn is designed so that negative electrode reserve capacity is set on the discharge side. In the initial period of the charge/discharge cycles, the battery voltage reaches the discharge cutoff voltage mainly due to the potential drop of positive electrode 10. Therefore, as shown in FIG. 3B, the charge/discharge efficiency in the positive electrode 10 is low in the initial period of the charge/discharge cycles. The reduction in capacity retention ratio in the initial period in FIG. 3A reflects this phenomenon. The charge depth of positive electrode 10 is thus large, so that the open circuit voltage is low as shown in FIG. 3C.

When the negative electrode reserve capacity is gradually consumed, the battery voltage reaches the discharge cutoff voltage due to both the decrease in potential of positive electrode 10 and the increase in potential of negative electrode 11. As a result, in a middle period of the charge/discharge cycles, the charge/discharge efficiencies of positive electrode 10 and negative electrode 11 become high. In this state, the charge depths of positive electrode 10 and negative electrode 11 balance, and hence the open circuit voltage increases as shown in FIG. 3C.

When the charge/discharge cycles further progress, negative electrode 11 starts to deteriorate. Therefore, as shown in FIG. 3B, the charge/discharge efficiency of the negative electrode 11 reduces. Thus, the battery voltage reaches the discharge cutoff voltage mainly due to increase in potential of negative electrode 11. When this state continues, negative electrode 11 further deteriorates, and the capacity retention ratio rapidly decreases as shown in FIG. 3A. When the charge depth of negative electrode 11 thus increases, the open circuit voltage decreases again as shown in FIG. 3C. When the charge/discharge cycles further progress, the battery voltage is affected by the increase of an internal resistance by, for example, electrolyte depletion and reaches the discharge cutoff voltage in a shallow state of the charge depth of positive electrode 10 and negative electrode 11. Therefore, the open circuit voltage increases again.

According to such a sequence of behavior, the open circuit voltage varies to form a circular arc with respect to the cycle number. Therefore, when the open circuit voltages after discharging for at least two different charge/discharge cycle numbers are detected in the charge/discharge cycles, the circular arc can be estimate and thus the lifetime and deterioration level can also be estimate. In this case, it is preferable that the voltages after discharging are the voltages in the open-circuit period after the battery is fully discharged. In other words, it is preferable that the voltages are measured in a state where the residual capacity is 10% or lower of that in the last full charge period. The voltages in this state are remarkably reflected by the deterioration state of negative electrode 11. Therefore, it is preferable to provide a measuring section for detecting the charge/discharge capacity of rechargeable lithium battery 1.

Determining section 5 may predict the number (cycle) or time available after the lifetime estimation based on the estimated lifetime and the use history of rechargeable lithium battery 1 at the estimation time. A display section or voice section for reporting it may be disposed. Thanks to this configuration, a user can know how long rechargeable lithium battery 1 can be used, and the convenience is improved.

In order to estimate the deterioration level, the following method is employed, for example. A circular arc is drawn by the open circuit voltages after discharging for at least two different cycle numbers of the cycles from the initial period to that time. The cycle number for which the battery reaches the end of its lifetime is estimated based on the size of the circular arc. The deterioration level can be estimated by linear approximation based on the capacity retention ratios for the cycle numbers at the initial period and the estimation time. The capacity retention ratio at the lifetime can be also calculated, so that the number of cycles to the lifetime can be predicted based on the capacity retention ratio.

Figure 4:
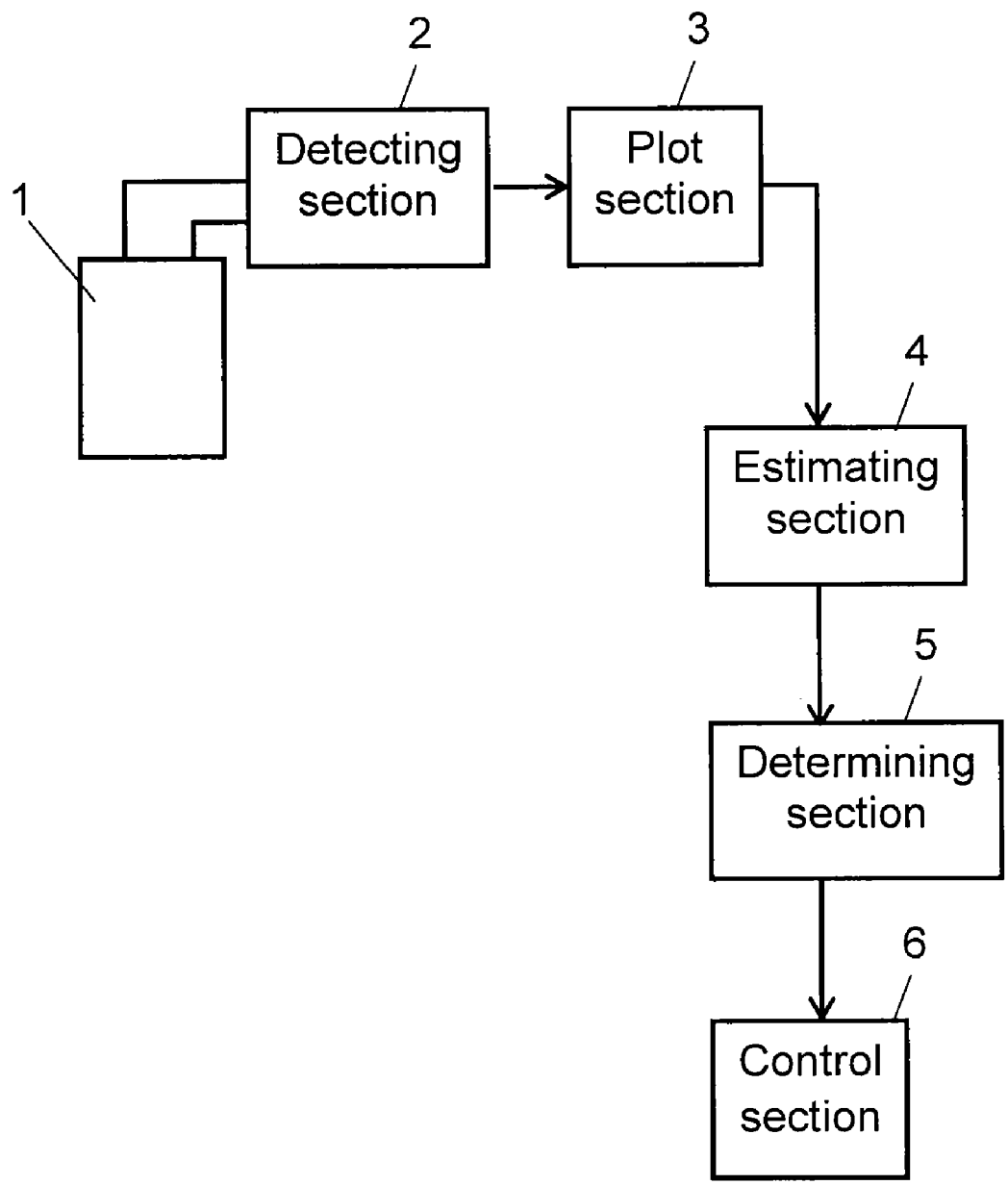
FIG. 4 is a block diagram showing a schematic configuration of a deterioration suppressor for the rechargeable lithium battery in accordance with the exemplary embodiment of the present invention.

Next, a method of suppressing further deterioration is described with reference to FIG. 4. In this method, charge, discharge, or both of them is controlled in response to the lifetime of the rechargeable lithium battery estimated by the lifetime estimating method for a rechargeable lithium battery in the exemplary embodiment. FIG. 4 is a block diagram showing a schematic configuration of a deterioration suppressor for the rechargeable lithium battery in accordance with the exemplary embodiment of the present invention. This deterioration suppressor has a configuration where control section 6 is added to the above-mentioned lifetime estimating apparatus.

Control section 6 varies the charge capacity, discharge capacity, or both of them based on the lifetime calculated by determining section 5. In other words, control section 6 forcibly decreases the charge capacity, discharge capacity, or both of them so as to suppress the progression of the deterioration according to the estimated lifetime. In this case, there are a method of shortening the charge time, the discharge time, or both charge and discharge times, and a method of varying the charge/discharge voltages of the battery so as to decrease the charge cutoff voltage and increase the discharge cutoff voltage.

When constant-voltage charging is performed, the charge depth is reduced by shortening the charge time, and the deterioration of rechargeable lithium battery 1 can be suppressed. When constant-current charging is performed, the charge depth is reduced by varying the charge cutoff voltage, and the deterioration of rechargeable lithium battery 1 can be suppressed. The discharge depth at the discharge cutoff time is reduced by shortening the discharge time or varying the discharge cutoff voltage, thereby increasing the residual capacity. The deterioration of rechargeable lithium battery 1 can be thus suppressed.

Figure 5:
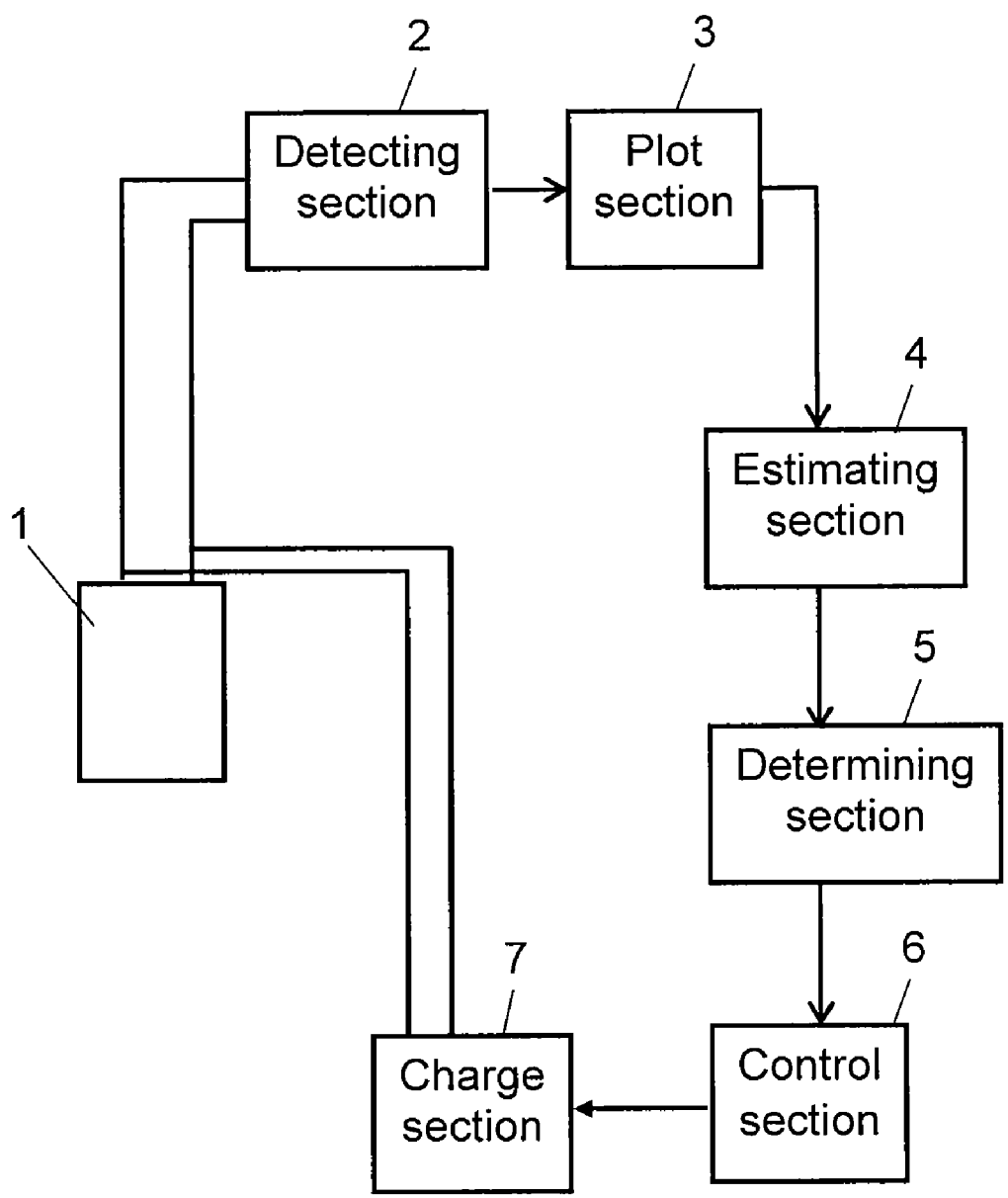
FIG. 5 is a block diagram showing a schematic configuration of a charger for the rechargeable lithium battery in accordance with the exemplary embodiment of the present invention.

Even when full charge, full discharge, or both of them of rechargeable lithium battery 1 is performed, the above-mentioned control can keep the charge depth of negative active material layer 11B within a set range. This deterioration suppressor of the exemplary embodiment is applicable to a discharge controller in order to control discharging, and to a charger in order to control charging. A battery pack may be formed as shown in FIG. 4. In other words, the battery pack can be formed by incorporating rechargeable lithium battery 1 and the deterioration suppressor. In this configuration, control section 6 controls the charge condition, the discharge condition, or both of them of rechargeable lithium battery 1. On the other hand, the configuration of the charger is shown in FIG. 5. In this configuration, charging section 7 for charging rechargeable lithium battery 1 is combined with the deterioration suppressor shown in FIG. 4. Control section 6 controls the charge condition of charging section 7.

When the lifetime is estimated and then the charge/discharge capacity is reduced by controlling the charge or discharge with the intension of suppressing the deterioration, the capacity discontinuously and rapidly varies with respect to the cycle number. The lifetime after that time therefore becomes different from the previously estimated lifetime. Therefore, the decreased capacity is stored, and the lifetime is estimated again by a procedure similar to the above-mentioned method based on the decreased capacity. Thus, the lifetime after the deterioration suppression can be estimated.

The present invention exerts its effect when negative electrode 11 of rechargeable lithium battery 1 has the negative active material containing at least one of elements, Si and Sn. Specifically, the negative active material includes elemental Si or Sn, an alloy containing Si or Sn, a compound containing Si or Sn and oxygen, and a compound containing Si or Sn and nitrogen. Negative active material layer 11B may be formed of one of these materials, or may be formed by combining two or more of the materials. The compound containing Si or Sn and nitrogen may further contain oxygen. Examples of negative active material layer 11B formed by combining two or more materials are compounds $SiO_xN_y$ and $SnO_xN_y$ containing Si or Sn, oxygen, and nitrogen. The negative active material made of a plurality of oxides $SiO_x$ and $SnO_x$ where the ratios of Si or Sn to oxygen are different is used. The negative active material containing Si or Sn may be either crystalline or amorphous.

In the case of the alloy, it is preferable that metal element M other than Si and Sn contained in the alloy is a metal element that does not form an alloy with lithium. Metal element M is not especially limited as long as it is a chemically-stable electronic conductor, but is preferably at least one selected from a group of titanium (Ti), copper (Cu), and nickel (Ni). Metal element M may be singly contained in the alloy, or two or more of metal elements may be contained in the alloy. The molar ratio between Si or Sn and metal element M in the alloy is not especially limited, but it is preferable that the ratio is within the following range.

When metal element M is Ti, $0<Ti/Si<2$ is preferable, and $0.1 \leq Ti/Si \leq 1.0$ is especially preferable.

When metal element M is Cu, $0<Cu/Si<4$ is preferable, and $0.1 \leq Cu/Si \leq 2.0$ is especially preferable.

When metal element M is Ni, $0<Ni/Si<2$ is preferable, and $0.1 \leq Ni/Si \leq 1.0$ is especially preferable.

When metal element M is Ti, $0<Ti/Sn<2$ is preferable, and $0.1 \leq Ti/Sn \leq 1.0$ is especially preferable.

When metal element M is Cu, $0<Cu/Sn<4$ is preferable, and $0.1 \leq Cu/Sn \leq 2.0$ is especially preferable.

When metal element M is Ni, $0<Ni/Sn<2$ is preferable, and $0.1 \leq Ni/Sn \leq 1.0$ is especially preferable.

The compound containing Si and oxygen is not especially limited, but preferably has composition expressed by general formula (1): $SiO_x$ (where, $0<x<2$). Here, value x indicating the content of oxygen element satisfies $0.01 \leq x \leq 1$, more preferably.

The compound containing Si and nitrogen is not especially limited, but preferably has composition expressed by general formula (2): $SiN_y$ (where, $0<y<4/3$). Here, value y indicating the content of nitrogen element satisfies $0.01 \leq y \leq 1$, more preferably.

The compound containing Sn and oxygen is not especially limited, but preferably has composition expressed by general formula (1): $SnO_x$ (where, $0<x<2$). Here, value x indicating the content of oxygen element satisfies $0.01 \leq x \leq 1$, more preferably.

The compound containing Sn and nitrogen is not especially limited, but preferably has composition expressed by general formula (2): $SnN_y$ (where, $0<y<4/3$). Here, value y indicating the content of nitrogen element satisfies $0.01 \leq y \leq 1$, more preferably.

The negative active material containing Si or Sn may be not only elemental Si or Sn, but also an alloy containing Si or Sn, a compound containing Si or Sn and oxygen, or a compound containing Si or Sn and nitrogen. There is no significant difference in charge/discharge reaction for reception and extraction of lithium ions between all the forms. The reason is described as follows: the charge/discharge reaction is basically alloying reaction between Si or Sn and lithium, and hence metal element M contained in the alloy of Si or Sn, and oxygen or nitrogen contained in the compound are not substantially involved in the charge/discharge reaction.

Thus, the alloy containing Si or Sn, the compound containing Si or Sn and oxygen, or the compound containing Si or Sn and nitrogen also causes the deterioration by the charge/discharge cycles in the same mechanism as that for elemental Si or Sn. It is thus necessary to set the negative active material of the alloy or compound to a non-fully charged state while the battery is fully charged or fully discharged, similarly to the negative active material of the elemental Si or Sn. In other words, the negative active material needs to be set to a non-fully charged state of 90% or less when the battery is fully charged, and to a non-fully charged state of 10% or more when the battery is fully discharged.

Exemplary Example

Next, the present invention is described specifically based on an exemplary example. However, the present invention is not limited to the following example.

In this example, the lifetime estimating method and the deterioration suppressing method of a rechargeable lithium battery according to the present invention are applied to a rechargeable lithium battery that employs lithium cobalt oxide ($LiCoO_2$) as the positive active material and silicon oxide $SiO_x$ as the negative active material. Negative electrode 11 and rechargeable lithium battery 1 are manufactured according to the following procedures, and their cycle life and discharge capacity are evaluated.

(1) Manufacturing of Negative Electrode

Figure 6:
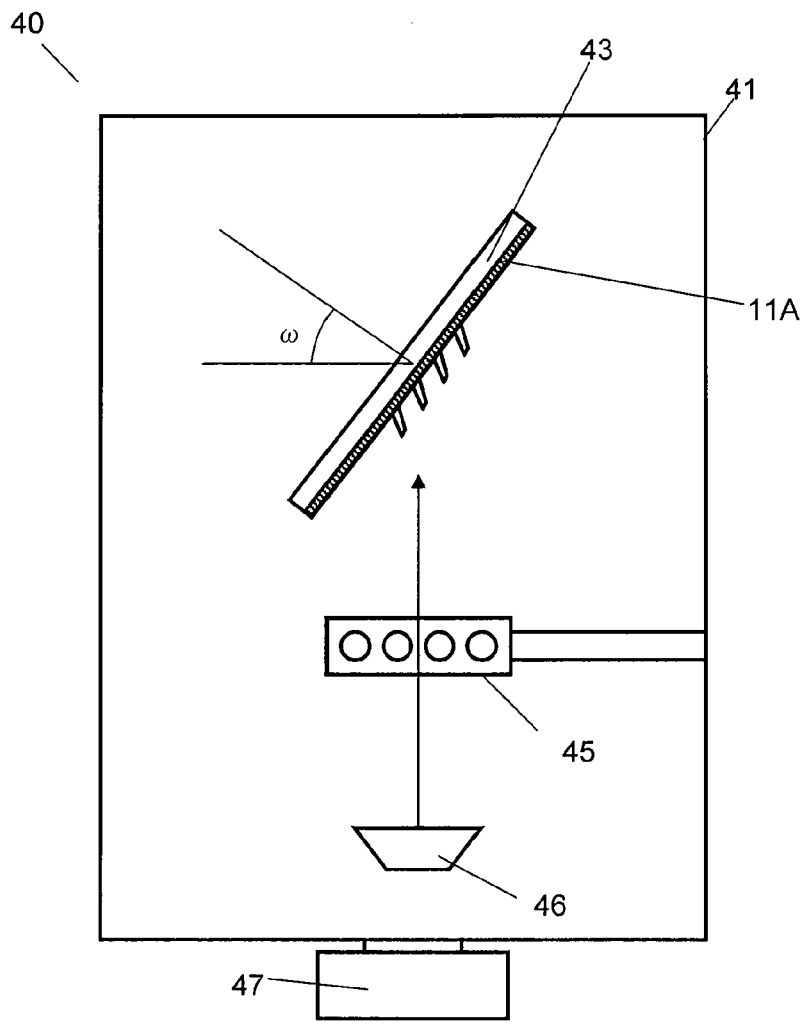
FIG. 6 is a block diagram of a manufacturing device of the negative electrode of the rechargeable lithium battery employed in the lifetime estimating method in accordance with the exemplary embodiment of the present invention.
Figure 7:
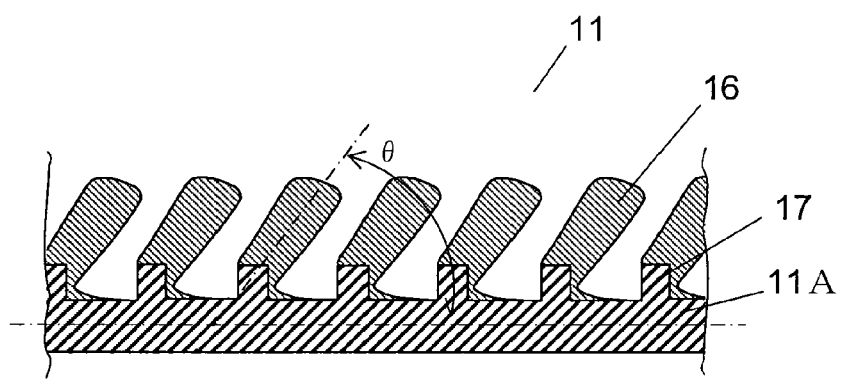
FIG. 7 is a sectional view of the negative electrode of the rechargeable lithium battery employed in the lifetime estimating method in accordance with the exemplary embodiment of the present invention.

FIG. 6 is a block diagram of a manufacturing device of the negative electrode of the rechargeable lithium battery employed in the lifetime estimating method in accordance with the exemplary embodiment of the present invention. FIG. 7 is a sectional view of the negative electrode of the rechargeable lithium battery employed in the lifetime estimating method in accordance with the exemplary embodiment of the present invention. Negative electrode 11 shown in FIG. 7 is manufactured using manufacturing device 40 shown in FIG. 6.

First, as negative electrode collector 11A, a 30-μm band-like electrolytic copper foil is used where projecting parts 17 with a width of 10 μm and a height of 7.5 μm are formed at an interval of 20 μm on its surface using a plating method.

Columnar bodies 16 made of $SiO_x$ are prepared by a reactive vacuum evaporation method, using evaporating unit 46 formed by unitizing an Si evaporation source, a crucible, and an electron beam generator. In this case, oxygen gas of purity of 99.7% is introduced into vacuum chamber 41 from nozzle 45 to vary the oxygen flow rate, thereby varying value x in the height direction. The inside of vacuum chamber 41 is decompressed by vacuum pump 47 to become an oxygen atmosphere of a pressure of 3.5 Pa. During evaporation, an electron beam generated by the electron beam generator is deflected by a deflecting yoke, and is radiated to the evaporation source. As the evaporation source, an end material (scrap silicon: purity of 99.999%) produced when a semiconductor wafer is formed is used.

Columnar bodies 16 are formed at a deposition rate of about 8 nm/s while angle ω of base 43 is adjusted so as to become 60°. Columnar bodies 16 where height is 30 μm and cross section is 150 μm² are thus formed.

When tilt angle θ of columnar bodies 16 with respect to the center line of negative electrode collector 11A is evaluated by cross section observation using a scanning electron microscope, the evaluated tilt angle is about 41°. The height of formed columnar bodies 16, namely the thickness of negative active material layer 11B, is 30 μm.

The oxygen distribution is investigated by linear distribution measurement in the sectional direction of columnar bodies 16 using an electron beam microprobe analyzer. As a result, in the height direction of columnar bodies 16, oxygen concentration (value x) continuously increases in the (180°−θ) direction from the tilt angle θ side. At this time, the range of x is 0.1 to 2, and the average is 0.6.

Thus, after negative electrode 11 having columnar bodies 16 on projecting parts 17 of negative electrode collector 11A is manufactured, lithium metal of 16 μm is evaporated on the surface of negative electrode 11 by a vacuum evaporation method. Copper-made negative electrode lead 15 is welded to a position of negative electrode collector 11A that does not face positive electrode 10.

(2) Manufacturing of Positive Electrode

A positive electrode having a positive active material that can absorb and release lithium ions is manufactured by the following method.

First, 93 parts by weight of $LiCoO_2$ powder as the positive active material and 4 parts by weight of acetylene black as a conductive agent are mixed. N-methyl-2-pyrrolidone (NMP) solution of polyvinylidene fluoride (PVDF) as a binder is mixed into the obtained powder so that the weight of the PVDF is 3 parts by weight. An appropriate amount of NMP is added to the obtained mixture to prepare a positive electrode mixture paste. The obtained positive electrode mixture paste is applied to positive electrode collector 10A made of a 15-μm thick aluminum (Al) foil using a doctor blade method, and is sufficiently dried at 85° C. Positive active material layer 10B is roll-pressed so that its density is 3.5 g/cm³ and its thickness is 160 μm, and is cut to manufacture positive electrode 10. Al-made positive electrode lead 14 is welded to a position of positive electrode collector 10A that does not face negative electrode 11.

(3) Manufacturing of Battery

Negative electrode 11 and positive electrode 10 manufactured in the above-mentioned procedures are laminated via 25-μm thick separator 12 made of porous polypropylene to form an electrode group of 40 mm×30 mm. The electrode group is impregnated with mixing solution of ethylene carbonate and diethyl carbonate containing $LiPF_6$, the electrode group is housed in Al-made outer casing 13, and the opening of outer casing 13 is sealed, thereby manufacturing laminated type rechargeable lithium battery 1. Here, the design capacity of the battery is assumed to be 21 mAh.

(4) Evaluation of Charge/Discharge Cycle Test

In a temperature-controlled chamber set to 25° C., a charge/discharge cycle is repeated under the following conditions on manufactured rechargeable lithium battery 1. Rechargeable lithium battery 1 is charged at a constant current of 1 C until the battery voltage becomes 4.20 V, and then is charged at a constant voltage of 4.20 V until the current value becomes 0.05 C. After a rest for 30 minutes, the battery is discharged at constant current of 0.2 C until the battery voltage becomes 3.0 V. This charge and discharge operation is repeated, and discharge capacity in each cycle is evaluated while the discharge capacity in third cycle is assumed to be 100.

Figure 8:
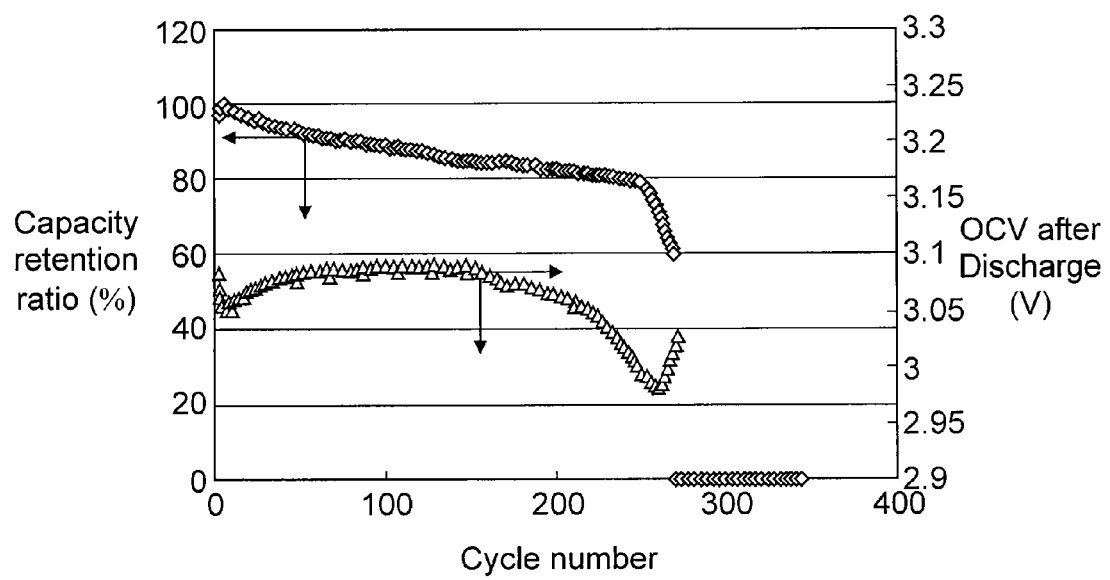
FIG. 8 is a plot diagram of the variation of the capacity retention ratio and open circuit voltage of the battery, which shows an exemplary example of the lifetime estimating method in accordance with the exemplary embodiment of the present invention.

The lifetime estimating method of the exemplary embodiment is applied to evaluation of the charge/discharge cycle test of item (4) using the lifetime estimating apparatus shown in FIG. 1. In other words, detecting section 2 monitors the open circuit voltage after 10 minutes after discharging in each cycle. FIG. 8 shows a plot result of the variation of the capacity retention ratio of the battery and the open circuit voltage.

As shown in FIG. 8, this battery reaches the end of its lifetime at about 280-th cycle. While, the open circuit voltage is maximal at about 140-th cycle. When the open circuit voltages for the cycle number corresponding to the maximum value and for another cycle number can be detected, estimating section 4 can draw a circular arc and determining section 5 can estimate the lifetime. Even when the cycle number corresponding to the maximum value cannot be detected, however, estimating section 4 can draw a circular arc when there are three or more different measurement results. Thus, detecting section 2 is required to detect the open circuit voltages of rechargeable lithium battery 1 after discharging for at least two different charge/discharge cycle numbers while charge/discharge cycles go on.

Alternatively, the following procedure may be employed. Detecting section 2 continuously detects the voltage in the circuit opening period after discharging, plot section 3 plots at least two of the detected voltage values, estimating section 4 draws a circular arc based on this plot, and determining section 5 predicts the lifetime. When the error contributing value of the other measurement points is 0.9 or more during drawing (curve fitting) of the circular arc by estimating section 4, the reliability of the circular arc is high. Determining section 5 may verify the reliability in such a manner.

Thus, detecting section 2 is required to detect the open circuit voltages of rechargeable lithium battery 1 after discharging for at least two different charge/discharge cycle numbers while the charge/discharge cycles go on. Plot section 3 is required to plot at least two of the detected voltage values with respect to the respective cycle numbers.

Figure 9:
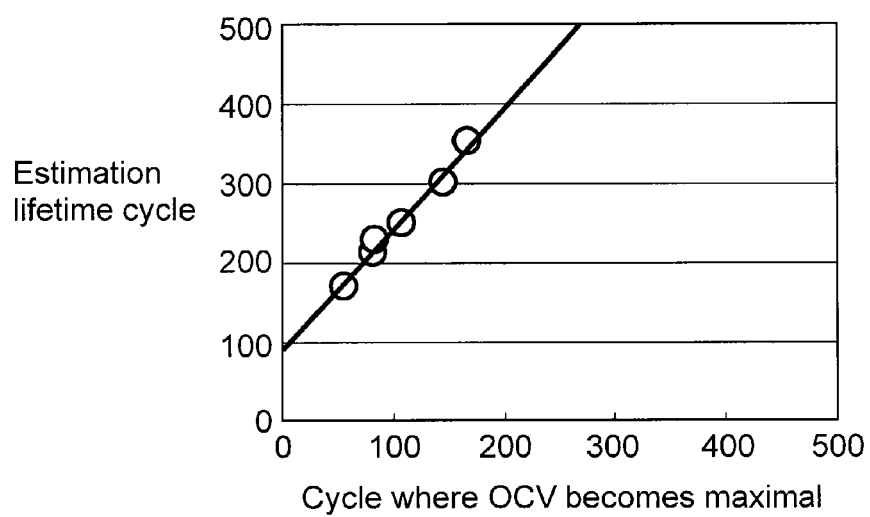
FIG. 9 is a plot diagram of the lifetime estimated by the lifetime estimating method with respect to the cycle number at which the open circuit voltage becomes maximal in accordance with the exemplary embodiment of the present invention.

The lifetime is varied by varying the composition of the negative active material or by other method, and the battery is formed and evaluated similarly to the above-mentioned manner. FIG. 9 shows a plot result of the lifetime estimated by a lifetime estimating method of the exemplary embodiment with respect to the cycle number for which the open circuit voltage has a maximum value.

As is clear from FIG. 9, the cycle number for which the open circuit voltage has a maximum value is about a half of the estimated lifetime, and hence the lifetime can be estimated with a half number of cycles. Therefore, the time required for evaluating the lifetime can be shortened.

INDUSTRIAL APPLICABILITY

The present invention relates to a rechargeable lithium battery that includes a positive electrode having a positive active material for absorbing and releasing lithium ions, a negative electrode having a negative active material that contains at least one of elements selected from a group of silicon and tin, and an electrolyte having lithium-ion conductivity. Estimating the lifetime of such a rechargeable lithium battery and suppressing the deterioration thereof allow use of the rechargeable lithium battery to be used for a long time.

The invention claimed is:

1. A method of estimating a lifetime of a rechargeable lithium battery, the rechargeable lithium battery comprising:
   a positive electrode having a positive active material capable of absorbing and releasing lithium ions;
   a negative electrode having a negative active material containing at least one of silicon and tin; and
   an electrolyte having lithium-ion conductivity and disposed between the positive electrode and the negative electrode,
   the method comprising:
   A) detecting an open circuit voltage of the discharged rechargeable lithium battery at least two times while the rechargeable lithium battery undergoes charge/discharge cycles;
   B) on a two-dimensional graph defined by the open circuit voltage and the charge/discharge cycle, plotting the detected at least two voltage values as a function of ordinal numbers of charge/discharge cycles at which the at least two voltage values are detected;
   C) drawing a circular arc on the graph such that the circular arc passes through the plotted at least two voltage values; and
   D) estimating the lifetime of the rechargeable lithium battery on the graph based on an ordinal number of a charge/discharge cycle at which the drawn circular arc is expected to come close to the open circuit voltage equal to or lower than a discharge end voltage.

2. The method of estimating the lifetime of the rechargeable lithium battery according to claim 1, further comprising
   E) predicting one of a number of charge/discharge cycles and a period of time remaining in the lifetime, based on the estimated lifetime of the rechargeable lithium battery and a usage history of the rechargeable lithium battery observed when the lifetime thereof is estimated.

3. The method of estimating the lifetime of the rechargeable lithium battery according to claim 1, further comprising:
   F) based on the estimated lifetime of the rechargeable lithium battery, controlling charging of the rechargeable lithium battery so as to reduce a usage capacity of the rechargeable lithium battery, in order to suppress deterioration of the rechargeable lithium battery; and
   G) memorizing the reduced usage capacity, and performing Step A through Step D to update the estimated lifetime of the rechargeable lithium battery while the rechargeable lithium battery undergoes charge/discharge cycles with the reduced usage capacity.

4. The method of estimating the lifetime of the rechargeable lithium battery according to claim 1, further comprising:
   F) based on the estimated lifetime of the rechargeable lithium battery, controlling discharging of the rechargeable lithium battery so as to reduce a usage capacity of the rechargeable lithium battery, in order to suppress deterioration of the rechargeable lithium battery; and G) memorizing the reduced usage capacity, and performing Step A through Step D to update the estimated lifetime of the rechargeable lithium battery while the rechargeable lithium battery undergoes charge/discharge cycles with the reduced usage capacity.

5. The method of estimating the lifetime of the rechargeable lithium battery according to claim 1, wherein the open circuit voltage is detected in step A when the rechargeable lithium battery is discharged from a fully charged level down to 10% or lower of the fully charged level.

6. A method of suppressing deterioration of a rechargeable lithium battery, the rechargeable lithium battery comprising:
a positive electrode having a positive active material capable of absorbing and releasing lithium ions;
a negative electrode having a negative active material containing at least one of silicon and tin; and
an electrolyte having lithium-ion conductivity and disposed between the positive electrode and the negative electrode,
the method comprising:
A) detecting an open circuit voltage of the discharged rechargeable lithium battery at least two times while the rechargeable lithium battery undergoes charge/discharge cycles;
B) on a two-dimensional graph defined by the open circuit voltage and the charge/discharge cycle, plotting the detected at least two voltage values as a function of ordinal numbers of charge/discharge cycles at which the at least two voltage values are detected;
C) drawing a circular arc on the graph such that the circular arc passes through the plotted at least two voltage values;
D) estimating the lifetime of the rechargeable lithium battery on the graph based on an ordinal number of a charge/discharge cycle at which the drawn circular arc is expected to come close to the open circuit voltage equal to or lower than a discharge end voltage; and
F) controlling charging of the rechargeable lithium battery based on the estimated lifetime thereof.

7. The method of suppressing the deterioration of the rechargeable lithium battery according to claim 6, wherein controlling charging of the rechargeable lithium battery comprises reducing a time for charging the rechargeable lithium battery.

8. The method of suppressing the deterioration of the rechargeable lithium battery according to claim 6, wherein controlling charging of the rechargeable lithium battery comprises changing a charge cutoff voltage therefor.

9. The method of suppressing the deterioration of the rechargeable lithium battery according to claim 6, wherein the open circuit voltage is detected in step A when the rechargeable lithium battery is discharged from a fully charged level down to 10% or lower of the fully charged level.

10. A method of suppressing deterioration of a rechargeable lithium battery, the rechargeable lithium battery comprising:
a positive electrode having a positive active material capable of absorbing and releasing lithium ions;
a negative electrode having a negative active material containing at least one of silicon and tin; and
an electrolyte having lithium-ion conductivity and disposed between the positive electrode and the negative electrode,
the method comprising:
A) detecting an open circuit voltages of the discharged rechargeable lithium battery at least two times while the rechargeable lithium battery undergoes charge/discharge cycles;
B) on a two-dimensional graph defined by the open circuit voltage and the charge/discharge cycle, plotting the detected at least two voltage values as a function of ordinal numbers of charge/discharge cycles at which the at least two voltage values are detected;
C) drawing a circular arc on the graph such that the circular arc passes through the plotted at least two voltage values;
D) estimating the lifetime of the rechargeable lithium battery on the graph based on an ordinal number of a charge/discharge cycle at which the drawn circular arc is expected to come close to the open circuit voltage equal to or lower than a discharge end voltage; and
F) controlling discharging of the rechargeable lithium battery based on the estimated lifetime thereof.

11. The method of suppressing the deterioration of the rechargeable lithium battery according to claim 10, wherein controlling discharging of the rechargeable lithium battery comprises reducing a time for discharging the rechargeable lithium battery.

12. The method of suppressing the deterioration of the rechargeable lithium battery according to claim 10, wherein controlling discharging of the rechargeable lithium battery comprises changing a discharge cutoff voltage therefor.

13. The method of suppressing the deterioration of the rechargeable lithium battery according to claim 10, wherein the open circuit voltage is detected when the rechargeable lithium battery is discharged from a fully charged level down to 10% or lower of the fully charged level.

14. A lifetime estimating apparatus for a rechargeable lithium battery, the rechargeable lithium battery comprising:
a positive electrode having a positive active material capable of absorbing and releasing lithium ions;
a negative electrode having a negative active material containing at least one of silicon and tin; and
an electrolyte having lithium-ion conductivity and disposed between the positive electrode and the negative electrode,
the apparatus comprising:
a detecting section configured to detect an open circuit voltage of the discharged rechargeable lithium battery at least two times while the rechargeable lithium battery undergoes charge/discharge cycles;
a plot section configured to use a two-dimensional graph defined by the open circuit voltage and the charge/discharge cycle to plot the detected at least two voltage values on the graph as a function of ordinal numbers of charge/discharge cycles at which the at least two voltage values are detected;
an estimating section configured to draw a circular arc on the graph such that the circular arc passes through the plotted at least two voltage values; and
a determining section configured to estimate the lifetime of the rechargeable lithium battery on the graph based on an ordinal number of a charge/discharge cycle at which the drawn circular arc is expected to come close to the open circuit voltage equal to or lower than a discharge end voltage.

15. The lifetime estimating apparatus for the rechargeable lithium battery according to claim 14, wherein
the determining section predicts one of a number of charge/discharge cycles and a period of time remaining in the lifetime of the rechargeable lithium battery, based on the estimated lifetime of the rechargeable lithium battery and a usage history of the rechargeable lithium battery observed when the lifetime thereof is estimated.

16. The lifetime estimating apparatus for the rechargeable lithium battery according to claim 14, further comprising:
a control section configured to control charging of the rechargeable lithium battery so as to reduce a usage capacity of the rechargeable lithium battery, based on the estimated lifetime thereof, in order to suppress deterioration of the rechargeable lithium battery,
wherein the determining section memorizes the reduced usage capacity, and updates the estimated lifetime of the rechargeable lithium battery while the rechargeable lithium battery undergoes charge/discharge cycles with the reduced usage capacity.

17. The lifetime estimating apparatus for the rechargeable lithium battery according to claim 14, further comprising:
a control section configured to control discharging of the rechargeable lithium battery so as to reduce a usage capacity of the rechargeable lithium based on the estimated lifetime thereof, in order to suppress deterioration of the rechargeable lithium battery,
wherein the determining section memorizes the reduced usage capacity, and updates the estimated lifetime of the rechargeable lithium battery while the rechargeable lithium battery undergoes charge/discharge cycles with the reduced usage capacity.

18. The lifetime estimating apparatus for the rechargeable lithium battery according to claim 14, wherein the detecting section detects the open circuit voltage when the rechargeable lithium battery is discharged from a fully charged level down to 10% or lower of the fully charged level.

19. A deterioration suppressor for a rechargeable lithium battery, the rechargeable lithium battery comprising:
a positive electrode having a positive active material capable of absorbing and releasing lithium ions;
a negative electrode having a negative active material containing at least one of silicon and tin; and
an electrolyte having lithium-ion conductivity and disposed between the positive electrode and the negative electrode,
the deterioration suppressor comprising:
a detecting section configured to detect an open circuit voltage of the discharged rechargeable lithium battery at least two times while the rechargeable lithium battery undergoes charge/discharge cycles;
a plot section configured to use a two-dimensional graph defined by the open circuit voltage and the charge/discharge cycle to plot the detected at least two voltage values on the graph as a function of ordinal numbers of charge/discharge cycles at which the at least two voltage values are detected;
an estimating section configured to draw a circular arc on the graph such that the circular arc passes through the plotted at least two voltage values; and
a determining section configured to estimate the lifetime of the rechargeable lithium battery on the graph based on an ordinal number of a charge/discharge cycle at which the drawn circular arc is expected to come close to the open circuit voltage equal to or lower than a discharge end voltage; and
a control section configured to control charging of the rechargeable lithium battery based on the estimated lifetime thereof.

20. The deterioration suppressor for the rechargeable lithium battery according to claim 19, wherein the detecting section detects the open circuit voltage when the rechargeable lithium battery is discharged from a fully charged level to 10% or lower of the fully charged level.

21. A battery pack comprising:
a rechargeable lithium battery including:
a positive electrode having a positive active material capable of absorbing and releasing lithium ions;
a negative electrode having a negative active material containing at least one of silicon and tin; and
an electrolyte having lithium-ion conductivity and disposed between the positive electrode and the negative electrode,
a detecting section configured to detect an open circuit voltage of the discharged rechargeable lithium battery at least two times while the rechargeable lithium battery undergoes charge/discharge cycles;
a plot section configured to use a two-dimensional graph defined by the open circuit voltage and the charge/discharge cycle to plot the detected at least two voltage values on the graph as a function of ordinal numbers of charge/discharge cycles at which the at least two voltage values are detected;
an estimating section configured to draw a circular arc on the graph such that the circular arc passes through the plotted at least two voltage values;
a determining section configured to estimate the lifetime of the rechargeable lithium battery on the graph based on an ordinal number of a charge/discharge cycle at which the drawn circular arc is expected to come close to the open circuit voltage equal to or lower than a discharge end voltage; and
a control section configured to control charging of the rechargeable lithium battery based on the estimated lifetime thereof.

22. The battery pack according to claim 21, wherein the detecting section detects the open circuit voltage when the rechargeable lithium battery is discharged from a fully charged level to 10% or lower of the fully charge level.

23. A charger for a rechargeable lithium battery, the rechargeable lithium battery comprising:
a positive electrode having a positive active material capable of absorbing and releasing lithium ions;
a negative electrode having a negative active material containing at least one of silicon and tin; and
an electrolyte having lithium-ion conductivity and disposed between the positive electrode and the negative electrode,
the charger comprising a deterioration suppressor which comprises:
a detecting section configured to detect an open circuit voltage of the discharged rechargeable lithium battery at least two times while the rechargeable lithium battery undergoes charge/discharge cycles;
a plot section configured to use a two-dimensional graph defined by the open circuit voltage and the charge/discharge cycle to plot the detected at least two voltage values on the graph as a function of ordinal numbers of charge/discharge cycles at which the at least two voltage values are detected;
an estimating section configured to draw a circular arc on the graph such that the circular arc passes through the plotted at least two voltage values;
a determining section configured to estimate the lifetime of the rechargeable lithium battery based on an ordinal number of a charge/discharge cycle at which the drawn circular arc is expected to come close to the open circuit voltage equal to or lower than a discharge end voltage;

a control section configured to control charging of the rechargeable lithium battery based on the estimated lifetime thereof; and a charging section configured to charge the rechargeable lithium battery in a manner controlled by the control section.

24. The charger according to claim 23, wherein the detecting section detects the open circuit voltage when the rechargeable lithium battery is discharged from a fully charged level to 10% or lower of the fully charged level.

25. A deterioration suppressor for a rechargeable lithium battery, the rechargeable lithium battery comprising:

a positive electrode having a positive active material capable of absorbing and releasing lithium ions;

a negative electrode having a negative active material containing at least one of silicon and tin; and an electrolyte having lithium-ion conductivity and disposed between the positive electrode and the negative electrode, the deterioration suppressor comprising:

a detecting section configured to detect an open circuit voltage of the discharged rechargeable lithium battery at least two times while the rechargeable lithium battery undergoes charge/discharge cycles;

a plot section configured to use a two-dimensional graph defined by the open circuit voltage and the charge/discharge cycle to plot the detected at least two voltage values on the graph as a function of ordinal numbers of charge/discharge cycles at which the at least two voltage values are detected;

an estimating section configured to draw a circular arc on the graph such that the circular arc passes through the plotted at least two voltage values;

a determining section configured to estimate the lifetime of the rechargeable lithium battery based on an ordinal number of a charge/discharge cycle at which the drawn circular arc is expected to come close to the open circuit voltage equal to or lower than a discharge end voltage; and a control section configured to control discharging of the rechargeable lithium battery based on the estimated lifetime thereof.

26. The deterioration suppressor of the rechargeable lithium battery according to claim 25, wherein the detecting section detects the open circuit voltage when the rechargeable lithium battery is discharged from a fully charged level to 10% or lower of the fully charged level.

27. A battery pack comprising:

a rechargeable lithium battery including:

a positive electrode having a positive active material capable of absorbing and releasing lithium ions;

a negative electrode having a negative active material containing at least one of silicon and tin; and an electrolyte having lithium-ion conductivity and disposed between the positive electrode and the negative electrode, a detecting section configured to detect an open circuit voltage of the discharged rechargeable lithium battery at least two times while the rechargeable lithium battery undergoes charge/discharge cycles;

a plot section configured to use a two-dimensional graph defined by the open circuit voltage and the charge/discharge cycle to plot the detected at least two voltage values on the graph as a function of ordinal numbers of charge/discharge cycles at which the at least two voltage values are detected;

an estimating section configured to draw a circular arc on the graph such that the circular arc passes through the plotted at least two voltage values;

a determining section configured to estimate the lifetime of the rechargeable lithium battery based on an ordinal number of a charge/discharge cycle at which the drawn circular arc is expected to come close to the open circuit voltage equal to or lower than a discharge end voltage; and a control section configured to control discharging of the rechargeable lithium battery based on the estimated lifetime thereof.

28. The battery pack according to claim 27, wherein the detecting section detects the open circuit voltage when the rechargeable lithium battery is discharged from a fully charged level to 10% or lower of that fully charged level.

* * * * *